(12) United States Patent
Takaki et al.

(10) Patent No.: US 7,180,930 B2
(45) Date of Patent: Feb. 20, 2007

(54) DFB SEMICONDUCTOR LASER DEVICE HAVING UNUNIFORM ARRANGEMENT OF A DIFFRACTION GRATING

(75) Inventors: Keishi Takaki, Tokyo (JP); Tomofumi Kise, Tokyo (JP); Masaki Funabashi, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 183 days.

(21) Appl. No.: 10/465,655

(22) Filed: Jun. 20, 2003

(65) Prior Publication Data

US 2004/0042516 A1    Mar. 4, 2004

(30) Foreign Application Priority Data

| Jun. 20, 2002 | (JP) | ............................. 2002-179680 |
| Jun. 21, 2002 | (JP) | ............................. 2002-181181 |
| Oct. 7, 2002  | (JP) | ............................. 2002-293222 |

(51) Int. Cl.
    *H01S 3/08* (2006.01)
(52) U.S. Cl. ...................................... 372/96
(58) Field of Classification Search ................... 372/96
    See application file for complete search history.

(56) References Cited

U.S. PATENT DOCUMENTS

| 5,329,542 | A  | * | 7/1994  | Westbrook ................... 372/96   |
| 5,581,572 | A  | * | 12/1996 | Delorme et al. .......... 372/50.11    |
| 5,659,562 | A  | * | 8/1997  | Hisa ............................. 372/96 |
| 5,926,497 | A  | * | 7/1999  | Nitta et al. ................... 372/96 |
| 5,960,023 | A  | * | 9/1999  | Takahashi ..................... 372/96  |
| 6,259,718 | B1 | * | 7/2001  | Okuda .......................... 372/96 |
| 6,459,840 | B1 | * | 10/2002 | Sato et al. ................... 385/129 |
| 6,594,298 | B2 | * | 7/2003  | Ryu et al. ................. 372/50.11  |
| 6,674,783 | B1 | * | 1/2004  | Funabashi et al. ............ 372/96    |
| 6,704,342 | B1 | * | 3/2004  | Funabashi et al. ............ 372/96    |

FOREIGN PATENT DOCUMENTS

JP        2001-168456  A  *  6/2001

* cited by examiner

*Primary Examiner*—James Menefee
(74) *Attorney, Agent, or Firm*—Oblon, Spivak, McClelland, Maier & Neustadt, P.C.

(57) ABSTRACT

A DFB semiconductor laser device includes a diffraction grating extending parallel to a laser cavity. The diffraction grating has ununiform structure wherein some of the corrugation patterns of diffraction grating are omitted periodically, the diffraction grating has different duty ratio between the area near the front facet of the laser cavity and the area near the rear facet, or the length of the diffraction grating is smaller than the cavity length and the width of the diffraction grating reduces in the vicinity of the rear end of the diffraction grating down to zero at the rear end.

16 Claims, 16 Drawing Sheets

DFB SEMICONDUCTOR LASER DEVICE HAVING UNUNIFORM ARRANGEMENT OF A DIFFRACTION GRATING

BACKGROUND OF THE INVENTION (a) Field of the Invention

The present invention relates to distributed-feedback semiconductor laser device (referred to as DFB laser device hereinafter) having ununiform arrangement of a diffraction grating.

(b) Description of the Related Art

A DFB laser device includes a diffraction grating having a periodic structure of the refractive index, wherein the real part and/or imaginary part of the refractive index changes periodically along the axial direction of the laser cavity. The diffraction grating allows a specific wavelength of the laser emission to be fed-back to the laser cavity, whereby the DFB laser device has a higher wavelength selectivity and thus lases at a single mode, i.e., at a signal wavelength.

Due to the higher wavelength selectivity as described above, the DFB laser device is suitably used as a light source for an optical communication. The DFB laser devices used in the optical communications are categorized in a variety of types including continuous wave emission type (CW-DFB) and, direct modulation type (DM-DFB).

A high-output-power CW-DFB laser device is generally used in combination with an external optical modulator and is used in an analog signal transmission. The CW-DFB laser device has an asymmetric reflection structure, wherein a low-reflection coating film is formed on the front facet (emission facet) of the laser cavity and a high-reflection coating film is formed on the rear facet. This asymmetric reflectance structure allows the laser cavity to emit most of the laser power at the front facet, thereby providing a higher output power efficiency.

In the CW-DFB laser device, the coupling factor κ is optimized in consideration of the single-mode characteristic, output power efficiency etc. in general. More specifically, an excessively higher κ value impairs a high output power, whereas an extremely lower κ value prevents the single-mode emission. Thus, the coupling factor κ is designed within a suitable range, and it is considered that κL, i.e, product of the coupling factor κ by the cavity length L, which is around "1" is most suitable from the view points of the single-mode characteristic, output power efficiency etc. The coupling factor κ in a DFB laser device is designed at a specified value by adjusting a variety of parameters such as the layer thickness, composition or duty ratio of the diffraction grating and the distance between the diffraction grating and the active layer. The term "duty ratio" as used herein means the ratio of the length of a higher refractive index portion to the length of a lower refractive index portion in the diffraction grating, the lengths being measured along the axial direction of the laser cavity.

In addition, in order to obtain a higher output power, it is effective to design a larger value for the cavity length L. The larger cavity length provides a higher output power while suppressing the thermal saturation, which generally occurs due to the heat generated by a higher driving current. To employ a larger cavity length L, however, the coupling factor κ should be designed smaller in view of the desired relationship $\kappa L \fallingdotseq 1$.

More specifically, if an extremely large cavity length L, e.g., L=1000 μm is desired, an extremely small coupling factor $\kappa \fallingdotseq 10$ cm$^{-1}$ should be employed in view of the relationship $\kappa L \fallingdotseq 1$. It is difficult in fact to achieve such a low coupling factor, however. It may be considered to employ a smaller layer thickness of the diffraction grating, or a smaller difference between the refractive indexes of the diffraction grating and the buried layer buried the diffraction grating, in order to achieve such an extremely low coupling factor. The mentioned smaller thickness or the smaller difference requires a higher accuracy in the fabrication process of the laser device, and is generally difficult to employ in the mass production of the laser devices. Thus, it is difficult to fabricate DFB laser devices having excellent single-mode characteristic in the conventional technique with a higher product yield.

For achieving a low coupling factor, it is possible in the conventional technique to employ a partial diffraction grating, wherein the diffraction grating is formed for a part of the laser cavity. The partial diffraction grating can advantageously reduce the effective coupling factor to the extent determined by the ratio of the length of the partial diffraction grating to the cavity length. However, this structure causes a discontinuity of the electric field at the boundary between the area including the diffraction grating and the area including no diffraction grating, raising the problem of ununiformity of the carrier density in the injected current. Thus, the gain difference between the lasing modes may be reduced, which causes an inter-mode transition in the laser device at a higher output power range, thereby generating an undesirable kink in the current dependency characteristic of the optical output power.

In the meantime, a conventional DFB laser device having a low-reflection coating film formed at the front facet of the laser cavity and a high-reflection coating film formed at the rear facet, as described before, generally involves a problem of hole burning, which causes an increase of the spectral linewidth in the laser emission.

SUMMARY OF THE INVENTION

In view of the above, it is an object of the present invention to provide a DFB laser device having a longer cavity length and capable of lasing at a single mode while suppressing the inter-mode transition.

It is another object of the present invention to provide a DFB laser device capable of achieving a narrow spectral linewidth, by suppressing a change of the optical power distribution and a hole burning problem at a high output power.

It is another object of the present invention to provide a DFB laser device having a higher optical output power and a narrow spectral linewidth at a higher optical output power, and capable of being manufactured with a higher single-mode product yield.

The present invention provides, in a first aspect thereof, a distributed feedback (DFB) semiconductor laser device including a laser cavity disposed between a first facet and a second facet of the laser device for emitting laser therefrom in an axial direction of the laser cavity, and a diffraction grating extending parallel to the axial direction for feedback of the laser to the laser cavity, the diffraction grating including a number (t) of corrugation patterns, which are arranged in the axial direction at a specified pitch except for omission of some of the corrugation patterns, wherein: the number (t) of the corrugation patterns satisfies the following relationship:

$$t < Lg \times 2n_{\it eff}/\lambda_{DFB},$$

wherein Lg, $\lambda_{DFB}$ and $n_{eff}$ are a length of the diffraction grating, a desired emission wavelength and an effective refractive index; and the order of the corrugation patterns in the diffraction grating is not an integer.

In accordance with the first aspect of the present invention, the omission of the corrugation patterns in the diffraction grating reduces the coupling factor of the diffraction grating, whereby the DFB laser devices each having a small coupling factor can be manufactured stably.

The present invention also provides, in a second aspect thereof, a distributed feedback (DFB) semiconductor laser device including a laser cavity disposed between a first facet and a second facet of the laser device for emitting laser therefrom in an axial direction of the laser cavity, and a diffraction grating extending parallel to the axial direction for feedback of the laser to the laser cavity, wherein at least one of duty ratio and width of the diffraction grating changes along the axial direction.

In accordance with the second aspect of the present invention, the change of duty ratio and width of the diffraction grating along the axial direction changes the coupling factor profile along the axial direction, and affords a desired optical power profile to the DFB laser device of the present invention, which may have a higher optical power in the central area of the laser cavity or may have a uniform optical power along the laser cavity.

The present invention also provides, in a third aspect thereof, a distributed feedback (DFB) semiconductor laser device including a laser cavity disposed between a first facet and a second facet of the laser device for emitting laser therefrom in an axial direction of the laser cavity, and a diffraction grating extending parallel to the axial direction for feedback of the laser to the laser cavity, wherein the diffraction grating has a length which is between 50% and 95%, inclusive of both, of a cavity length of the laser cavity.

In accordance with the third aspect of the present invention, the length of the diffraction grating which is between 50% and 95%, inclusive both suppresses the hole burning problem at a higher injected current to reduce the spectral linewidth of the laser emission, thereby providing a higher single-mode product yield to the fabrication process for the DFB laser devices.

The above and other objects, features and advantages of the present invention will be more apparent from the following description, referring to the accompanying drawings.

PREFERRED EMBODIMENTS OF THE INVENTION

Figure 1:
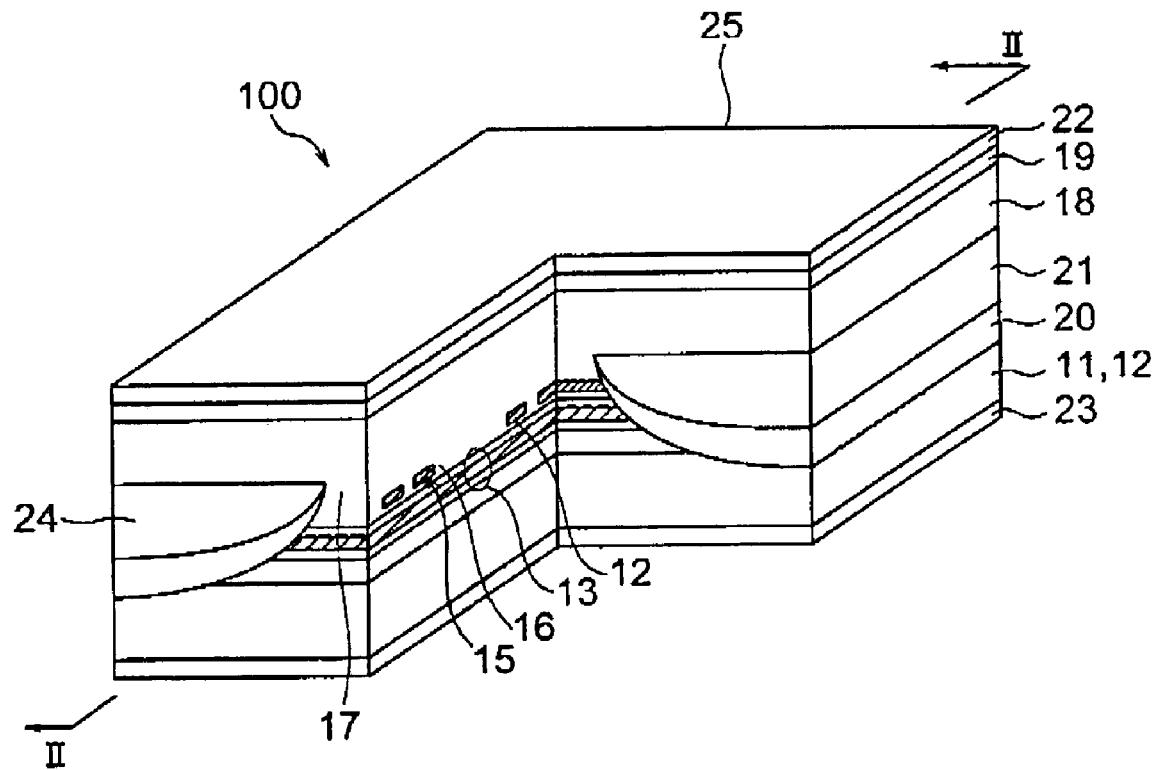
FIG. 1 is a partially cut-out perspective view of a DFB laser device according to a first embodiment of the present invention.

Now, the present invention is more specifically described with reference to accompanying drawings, wherein similar constituent elements are designated by similar reference numerals.

First Embodiment

Referring to FIG. 1, a DFB laser device, generally designated by numeral 100, according to a first embodiment of the present invention is configured as a buried-heterostructure DFB laser device having a cavity length of 1200 μm and an emission wavelength of 1550 nm. The DFB laser device 100 includes an n-InP substrate 11 having a thickness of about 120 μm, and a layer structure including n-InP buffer layer 12, active layer 13 of a multiple-quantum-well separate confinement heterostructure (MQW-SCH), p-InP spacer layer 14, 10-nm-thick diffraction grating 15, p-InP buried layer 16 buried the diffraction grating 15, and p-InP cladding layer 17, which are consecutively formed on the n-InP substrate 11. The MQW-SCH active layer 13 includes therein six quantum well layers in this example.

Figure 2:
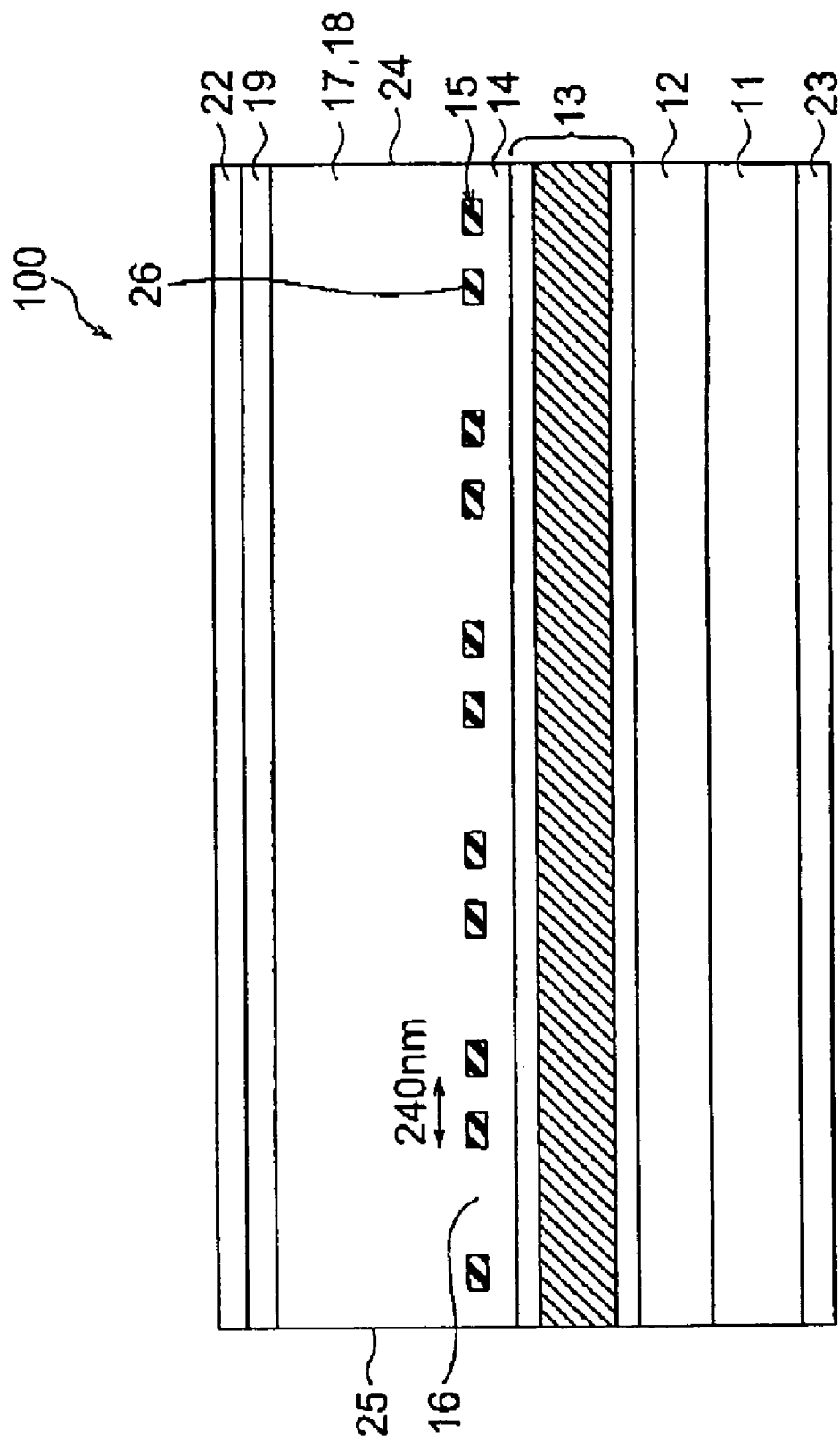
FIG. 2 is a sectional view taken along line II—II in FIG. 1.

The diffraction grating 15 is made of quaternary semiconductor, InGaAsP, having a bandgap wavelength μg of 1100 nm. Referring to FIG. 2, the diffraction grating 15 includes a plurality of corrugation patterns 26 arranged along the axial direction of the laser cavity at a spatial period (pitch) of 240 nm, with one of every three corrugation patterns being omitted at a constant pitch. In this configuration of the diffraction grating 15, the ratio of the width of the corrugation pattern to the distance between adjacent two corrugation patterns 26 is designed at 3:7 so as to obtain a coupling factor κ of about 10 cm$^{-1}$.

In the present embodiment, the omission of one of every three corrugation patterns at the constant pitch allows the diffraction grating 15 to have an effective coupling factor equal to around ⅔ of the coupling factor κ of a diffraction grating without such a pattern omission. In addition, since the spatial period of the pattern omission is on the submicron order, generation of the discontinuity in the electric field distribution can be suppressed, which is the problem in the conventional DFB laser device having a partial diffraction grating.

Among the layers in the layer structure, p-InP cladding layer 17, p-InP buried layer 16, diffraction grating 15, p-InP spacer layer 14, MQW-SCH active layer 13 and the top portion of the n-InP buffer layer 12 are configured as a mesa stripe having a width of about 1.8 μm as measured at the depth of the MQW-SCH active layer 13. Both the sides of the mesa stripe are buried by a carrier blocking structure including p-InP layer 20 and n-InP layer 21 forming a p-n junction.

On the p-InP cladding layer 17 and the n-InP layer 21 disposed on both sides of the p-InP cladding layer 17, a p-InP cladding layer having a thickness of about 2 μm and a heavily-doped GaInAs contact layer 19 are consecutively deposited. The heavily-doped GaInAs contact layer 19 is doped with a p-type dopant for obtaining an effective ohmic contact with a p-side electrode 22.

The p-side electrode 22 including Ti/Pt/Au layers is formed on the heavily-doped GaInAs contact layer 19, whereas an n-side electrode 23 including a AuGeNi alloy is formed on the bottom surface of the n-InP substrate 11. The DFB laser device 100 includes a non-reflection coating film on the front facet 24 of the laser cavity, and a high-reflection coating film having a reflectance of around 90% on the rear facet 25.

In the fabrication process for fabricating the DFB laser device 100 of the present embodiment, n-InP buffer layer 12, MQW-SCH active layer 13, p-InP spacer layer 14 and diffraction grating layer 15a are consecutively grown on an n-InP substrate 11 at a substrate temperature of 600 degrees C. As the diffraction grating layer 15a, an InGaAsP layer having a bandgap wavelength of 1100 nm is grown. For growing the MQW-SCH active layer 13, a MQW structure including six quantum well layers is formed.

Figure 3:
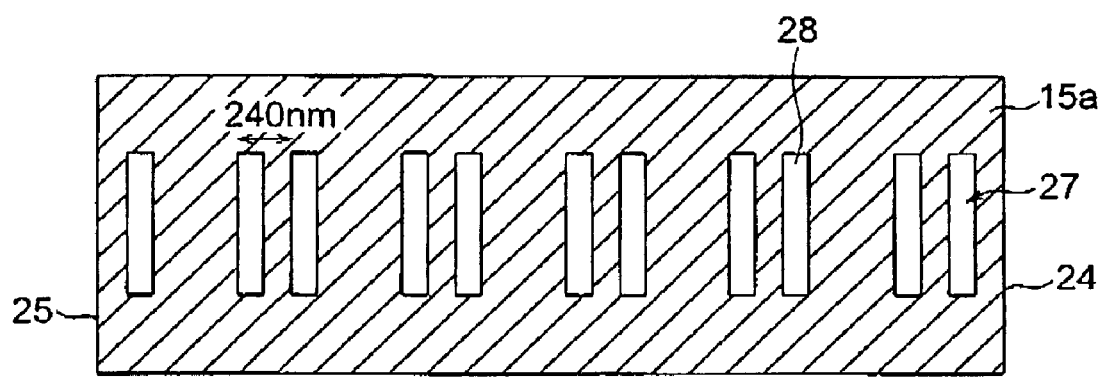
FIG. 3 is a top plan view of the diffraction grating shown in FIG. 1 during a fabrication process thereof.

Subsequently, a resist layer for an electron-beam-exposure use is formed up to a thickness of 100 nm by using a coating technique, followed by electron-beam irradiation on the resist film to obtain a diffraction grating mask 27 including a plurality of corrugation patterns 28, such as shown in FIG. 3. The diffraction grating mask 27 has a spatial period of 240 nm for the arrangement of the corrugation patterns 28, wherein one of every three corrugation patterns 28 is omitted at a constant pitch. A ratio of the width of each corrugation pattern 28 to a distance between two corrugation patterns juxtaposed is set at 3:7.

Subsequently, the diffraction grating layer 15a is etched by a dry etching technique using methane/hydrogen gas and the diffraction grating mask 27 so as to form separate corrugation patterns 28, thereby forming the diffraction grating 15. Thereafter, a MOCVD technique is used for growing the p-InP buried layer 16 and p-InP cladding layer 17 for buried the diffraction grating 15.

The pattern omission structure of the diffraction grating 15 as described above allows the diffraction grating 15 to have an effective coupling factor equal to ⅔ of the coupling factor κ of a diffraction grating without the pattern omission structure. This obviates the necessity of achieving a higher accuracy in fabrication of the diffraction grating, whereby a large number of DFB laser devices each having a coupling factor as low as 10 cm$^{-1}$ can be fabricated with excellent stability.

Subsequently, a plasma-enhanced CVD technique is used for depositing a SiNx film on the entire surface of the wafer, followed by photolithographic and reactive-ion etching (RIE) processes to etch the SiNx film to obtain a stripe SiNx mask extending in the direction of arrangement of the corrugation patterns. By using the stripe SiNx mask as an etching mask, p-InP cladding layer 17, p-InP buried layer 16, diffraction grating 15, p-InP spacer layer 14, MQW-SCH active layer 13 and the top portion of n-InP buffer layer 12 are etched to configure a mesa stripe having a width of about 1.8 μm at the depth of the MQW-SCH active layer 13.

Subsequently, by using the SiNx mask as a selective growth mask, p-InP layer 20 and n-InP layer 21 are consecutively grown on both the sides of the mesa stripe to thereby form a carrier blocking structure. After removing the SiNx mask, a 2-μm-thick p-InP cladding layer 18 and a heavily doped InGaAs contact layer 19 are consecutively grown thereon.

Subsequently, Ti/Pt/Au metallic films are formed as the p-side electrode 22 on the heavily-doped InGaAs contact layer 19. After polishing the bottom surface of the n-InP substrate 11 down to a thickness of around 120 μm, a AuGeNi alloy film is formed as the n-side electrode 23 on the bottom surface of the n-InP substrate 11.

The resultant wafer is cleaved at the front facet and the rear facet of the laser cavity to obtain a cavity length of 1200 μm for the laser device, followed by coating the front facet with a non-reflection coating film and the rear facet with a high-reflection coating film. After separating the cleaved wafer into a number of DFB laser chips, a wire-bonding process is conducted to the chips to obtain product DFB laser devices of the present embodiment.

In the present embodiment, the pattern omission structure as described above achieves a lower coupling factor as low as 10 cm$^{-1}$, without requiring a higher fabrication accuracy for the laser devices. This provides a stable fabrication process for the DFB laser devices having an excellent single-mode characteristic. Since omission pitch of the corrugation patterns is on the submicron order, discontinuity of electric field distribution as encountered in the conventional laser device having a partial diffraction grating can be effectively suppressed to hinder the inter-mode transition, thereby preventing generation of the undesirable kink.

For evaluating the performances of DFB laser device of the present embodiment, a DFB laser device was fabricated as a comparative example. This comparative example was similar to the first embodiment except that the diffraction grating had a uniform arrangement of the corrugation patterns and that the emission wavelength was set at 1551 nm in the comparative example. This configuration of the diffraction grating provided a coupling factor of about 15 cm$^{-1}$. The comparative example could be fabricated in a process similar to the fabrication process for the first embodiment.

Figure 4A:
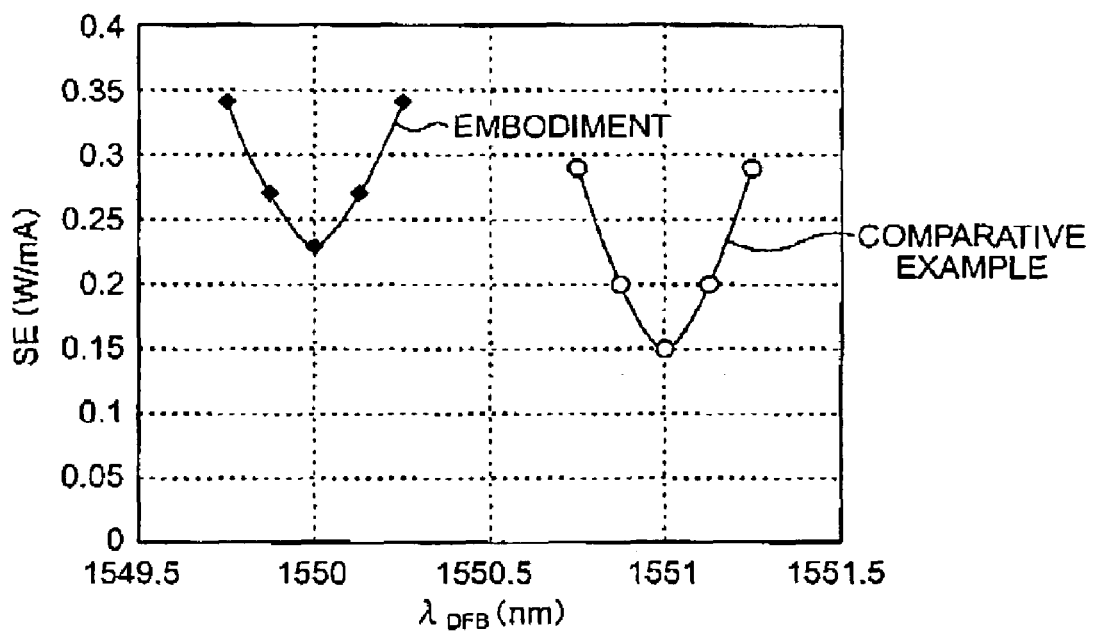
FIG. 4A is a graph showing the relationship between the emission wavelength $\lambda_{DFB}$ and the output power efficiency (slope efficiency) of the DFB laser device of FIG. 1 and a comparative example.

The wavelength dependency of the optical output power efficiency, i.e., slope efficiency (SE) was evaluated for the DFB laser devises of the first embodiment and the comparative example, the results of which are illustrated in FIG. 4A. The term "slope efficiency" as used herein means the gradient of optical output power with respect to the injected current. The slope efficiency SE generally varies with the change of the wavelength in each DFB laser device, which depends on the relative locational phase (θ) determined by the position of the rear facet of the laser cavity relative to the position of the diffraction grating. In FIG. 4A, θ=2/π corresponds to the emission wavelength and θ=0 and π correspond to both the ends of each graph.

As understood from FIG. 4A, the first embodiment achieved 0.35 mW/mA for the maximum slope efficiency SE, which is 1.25 times higher than the maximum slope efficiency SE of the comparative example.

Figure 4B:
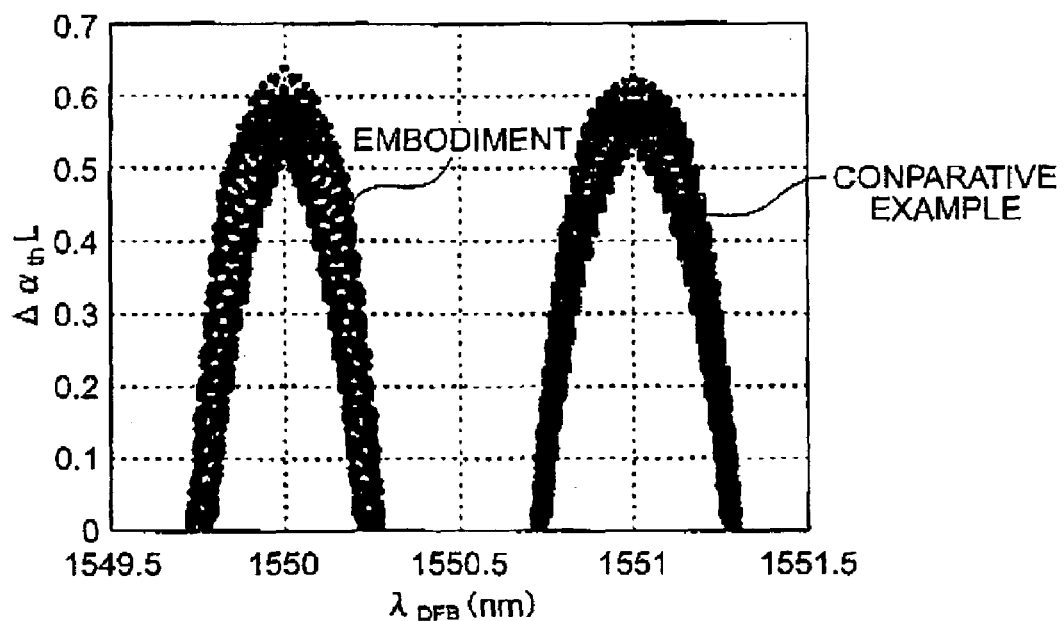
FIG. 4B is a graph showing the relationship between the emission wavelength $\lambda_{DFB}$ and the threshold gain difference of the DFB laser device of FIG. 1 and a comparative example.

The wavelength dependency of the threshold gain difference ($\Delta\alpha_{th}L$) was also evaluated by simulation for the first embodiment and the comparative example, the results of which are shown in FIG. 4B. The term "threshold gain difference $\Delta\alpha_{th}L$" as used herein means a gain difference for the threshold between the main emission wavelength and the subordinate emission wavelength, which exhibits the single-mode characteristic of the DFB laser device. The threshold gain difference $\Delta\alpha_{th}L$ generally varies with frequencies deviated from the emission frequency, which depends on the relative phase θ of the rear facet with respect to the diffraction grating, similarly to the case of slope efficiency.

As understood from FIG. 4B, there is no substantial difference in the threshold gain difference between the first embodiment and the comparative example.

Second Embodiment

Figure 5A:
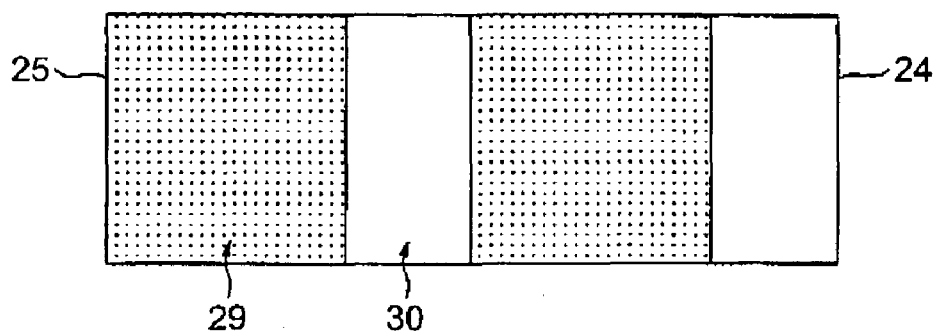
FIGS. 5A to 5D are schematic top plan views of diffraction gratings in DFB laser devices of first to fourth examples according to a second embodiment of the present invention.

Referring to FIGS. 5A to 5D, there are shown schematic top plan views of the diffraction gratings of DFB laser devices of first to fourth examples according to a second embodiment of the present invention In FIG. 5A, the DFB laser device of the first example of the present embodiment has a partial diffraction grating structure which includes a pair of diffraction grating areas 29 each having therein a diffraction grating and a pair of Fabry-Perot areas 30 each having therein no diffraction grating, which are alternately arranged from the rear facet 25 to the emission facet (front facet) 24 of the laser cavity along the axial direction thereof. The diffraction grating of the diffraction grating area 29 is similar to the diffraction grating shown in FIG. 2 except that the diffraction grating of the diffraction grating area 29 has a uniform arrangement of the corrugation patterns.

The ratio of the length of the diffraction grating area 29 to the length of the Fabry-Perot area 30 is set at 2:1. This arrangement of the partial diffraction grating provides a coupling factor of about 10 cm$^{-1}$. The other configurations of the second embodiment are similar to those in the first embodiment.

In the fabrication of the DFB laser device of the present example, upon the EB irradiation process for the diffraction grating mask, four zones including two zones each having a diffraction grating pattern wherein the corrugation patterns are uniformly arranged and two zones each having no diffraction grating pattern are alternately disposed, with the ratio for the lengths of the areas being set at 2:1. The present example achieves suppression of discontinuity of the electric field, inter-mode transition in the laser emission and thus generation of undesirable kink, similarly to the first embodiment. The patterning of the resist film forming the diffraction grating may be performed by using an ordinary photolithographic technique instead of the EB exposure.

Figure 5B:
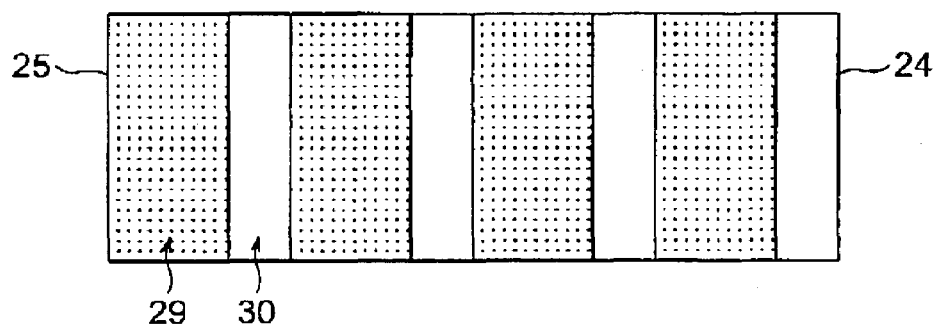

Referring to FIG. 5B, there is shown a DFB laser device of the second example according to the second embodiment, similarly to FIG. 5A. The second example is similar to the first example except that eight zones including four diffraction grating areas 29 and four Fabry-Perot areas 30 are alternately arranged in the present example. The ratio between the lengths of the diffraction grating area 29 and the Fabry-Perot area 30 is set at 2:1, as in the case of the first example. The second example of the present embodiment is somewhat more advantageous over the first example.

Figure 5C:
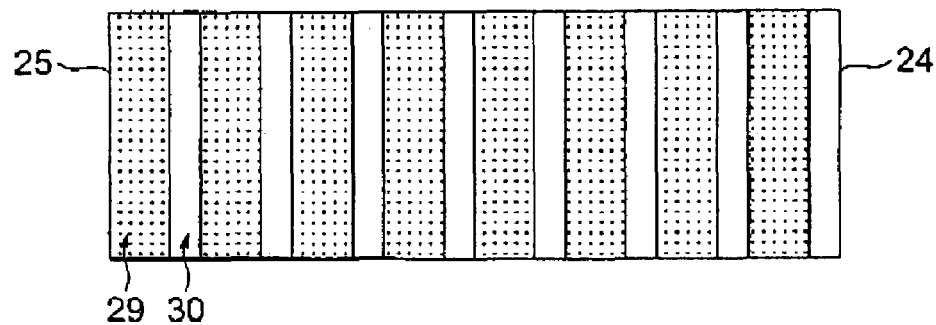

Referring to FIG. 5C, there is shown a DFB laser device of the third example according to the second embodiment of the is present invention, similarly to FIG. 5A. The third example is similar to the first example except that sixteen zones including eight diffraction grating areas 29 and eight Fabry-Perot areas 30 are alternately arranged in the present example. The ratio between the lengths of the diffraction grating area 29 and the Fabry-Perot area 30 is set at 2:1, as in the case of the first example. The third example of the present embodiment is somewhat more advantageous over the second example.

Figure 5D:
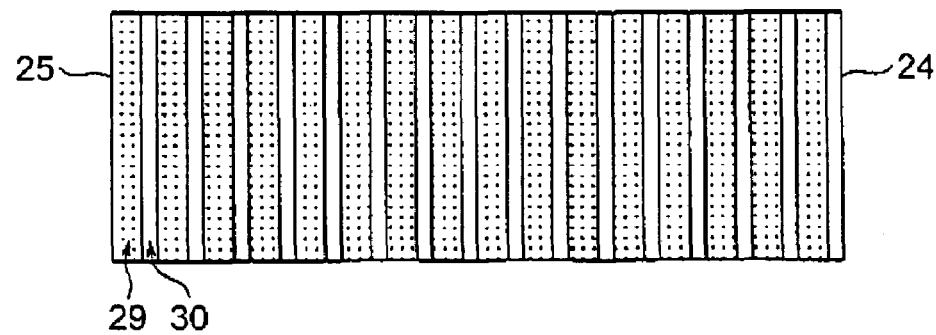

Referring to FIG. 5D, there is shown a DFB laser device of the fourth example according to the second embodiment of the present invention, similarly to FIG. 5A. The fourth example is similar to the first example except that thirty-two zones including sixteen diffraction grating areas 29 and sixteen Fabry-Perot areas 30 are alternately arranged in the present example. The ratio between the lengths of the diffraction grating area 29 and the Fabry-Perot area is set at 2:1, as in the case of the first example. The fourth example of the present embodiment is somewhat more advantageous over the third example. In the structure of the second embodiment, the number of zones and the ratio for the lengths may be selected as desired.

Figure 6:
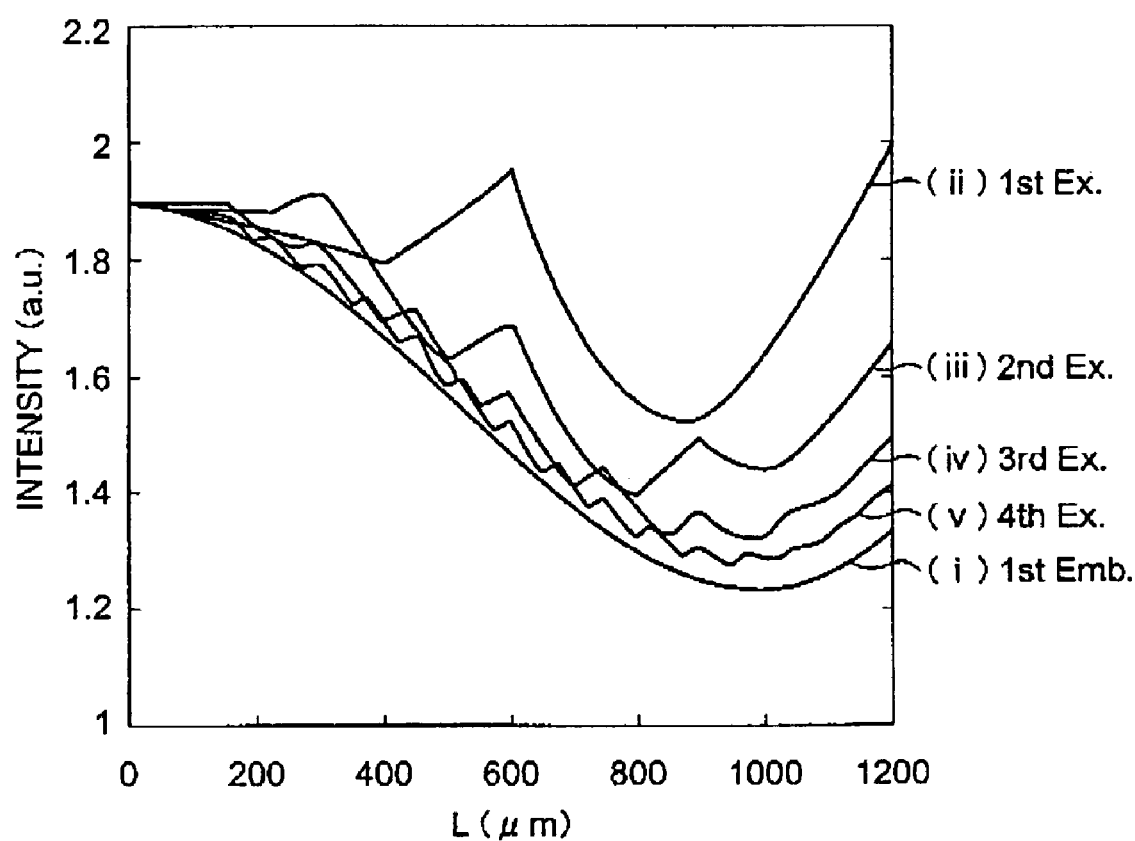
FIG. 6 is a graph showing electric field distribution profiles within the laser cavities of the DFB laser device of the first and second embodiments.

A simulation is performed for evaluating the electric field distributions in the DFB laser devices of the first embodiment and first to fourth examples of the second embodiment, the results of which are depicted in FIG. 6. Each laser device had a cavity length of 1200 μm, and the intensity of electric field therein is plotted along the distance measured from the rear facet of the laser cavity. As will be understood from FIG. 6, the discontinuity of the electric field in the laser cavity is more effectively suppressed by increasing the numbers of the diffraction grating areas and the Fabry-Perot areas. In other words, a smaller spatial period of the omission of the corrugation pattern more effectively suppresses the discontinuity of the electric field distribution, and in this respect, the configuration of the first embodiment is most superior wherein the spatial period of the omission of the corrugation patterns is on the submicron order.

Figure 7A:
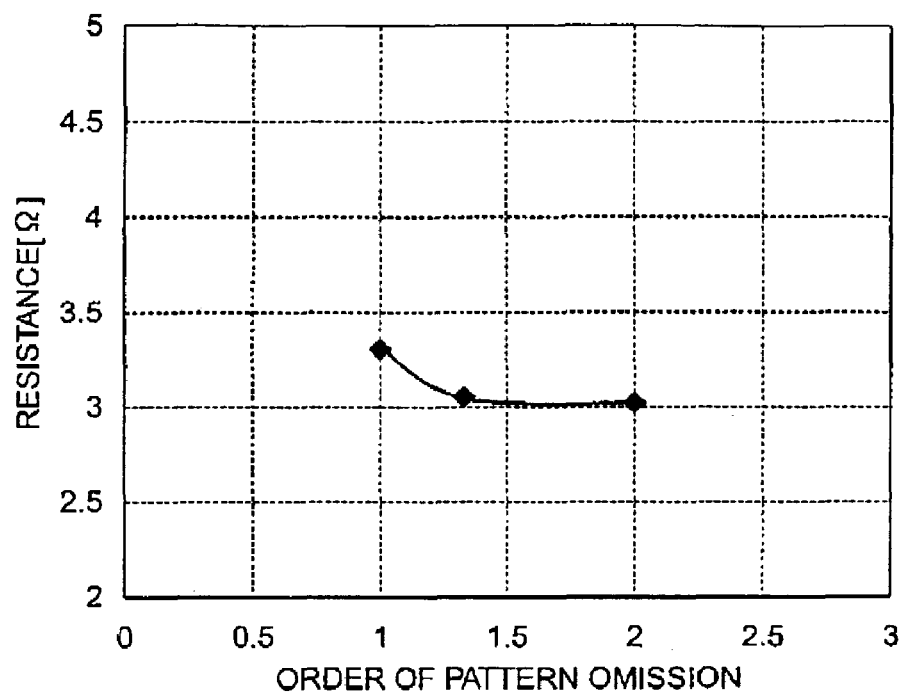
FIG. 7A is a graph showing the relationship between the device resistance and the order of corrugation pattern in the diffraction grating.

The omission of the corrugation patterns in the diffraction grating has additional advantages of smaller device resistance and a resultant increase of the optical output power in the laser device. Referring to FIG. 7A, there is shown the relationship between device resistance and the order (n) of the corrugation patterns in is the diffraction grating. The order (n) of the corrugation patterns is defined as the reciprocal number of the probability of the presence of the corrugation patterns at each position determined by the spatial period, with the probability for the case of uniform arrangement of the corrugation patterns being "1". More concretely, if one of every four corrugation patterns, for example, is omitted in the diffraction grating, the probability of the presence of a corrugation pattern assumes ¾ at each position determined by the spatial period, whereby the reciprocal (n) of the probability is 4/3=1.33 . . . .

Figure 7B:
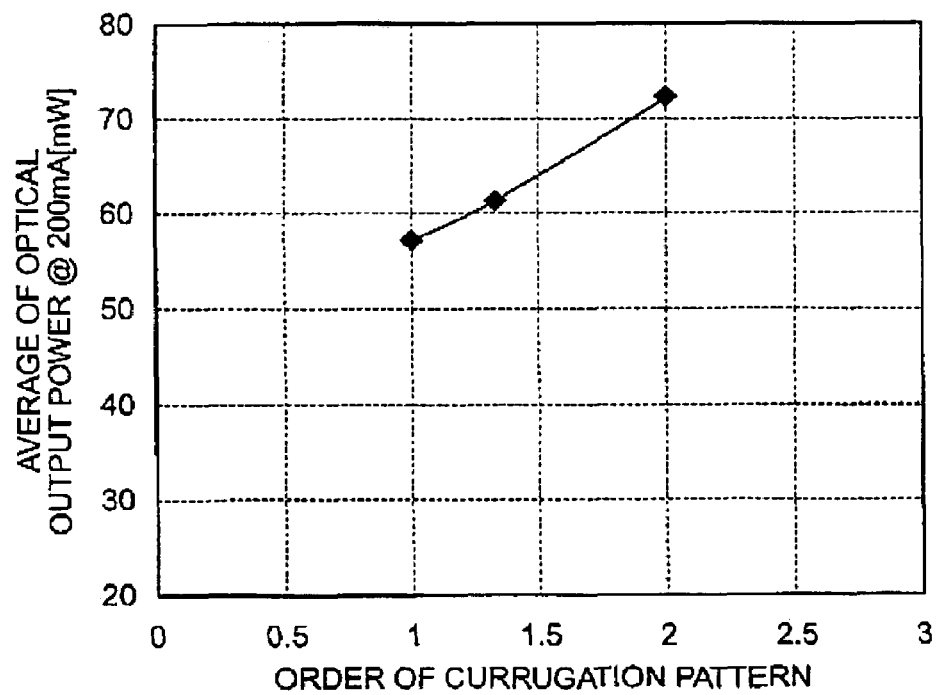
FIG. 7B is a graph showing the relationship between the average of optical output power and the order of corrugation pattern in the diffraction grating.

As shown in FIG. 7A, the implicit device resistance of the DFB laser device is reduced by a larger number of the corrugation patterns. This is because the diffraction grating layer has a resistance higher than the resistance of the buried layer and other layers. Referring to FIG. 7B, the average of optical output powers measured for the samples at an injection current of 200 mA are increased as viewed toward a higher order (n) of the pattern due to the reduction of the device resistance.

Third Embodiment

Figure 8:
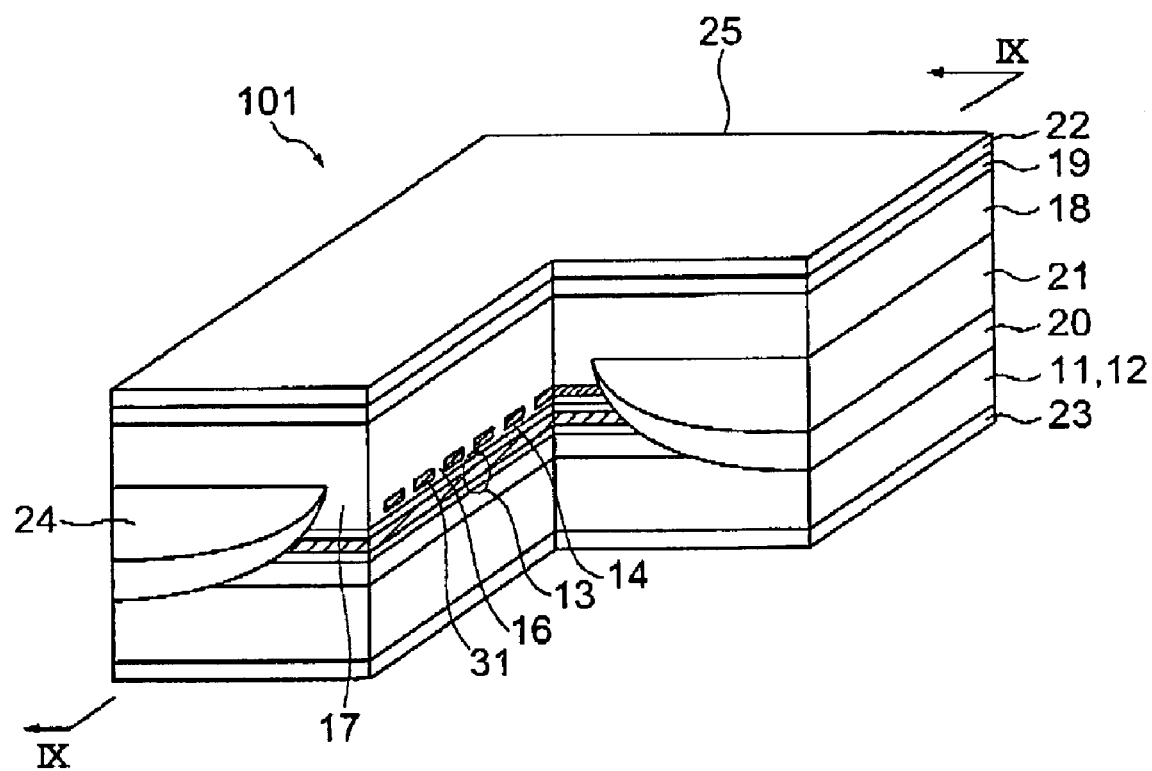
FIG. 8 is a partially cut-out perspective view of a DFB laser device according to a third embodiment of the present invention.

Referring to FIG. 8, a DFB laser device, generally designated by numeral 101, according to a third embodiment of the present invention has an emission wavelength of 1550 nm, a cavity length of 500 μm, and a specific structure for the diffraction grating, which provides a larger value for the coupling factor κ in the vicinity of the front facet of the laser cavity and a smaller value for the vicinity of the rear facet of the laser cavity.

More specifically, the DFB laser device 101 of the present embodiment includes a 120-μm-thick n-InP substrate 11, and a layer structure including n-InP buffer layer 12, MQW-SCH active layer 13, p-InP spacer layer 14, InGaAsP diffraction grating 31, p-InP buried layer 16 buried the diffraction grating 31, and p-InP cladding layer 17, which are consecutively formed on the n-InP substrate 11. These and other structures including the mesa structure of the DFB laser device 101 of the present embodiment are similar to the structures of the DFB laser device 100 of the first embodiment.

Figure 9:
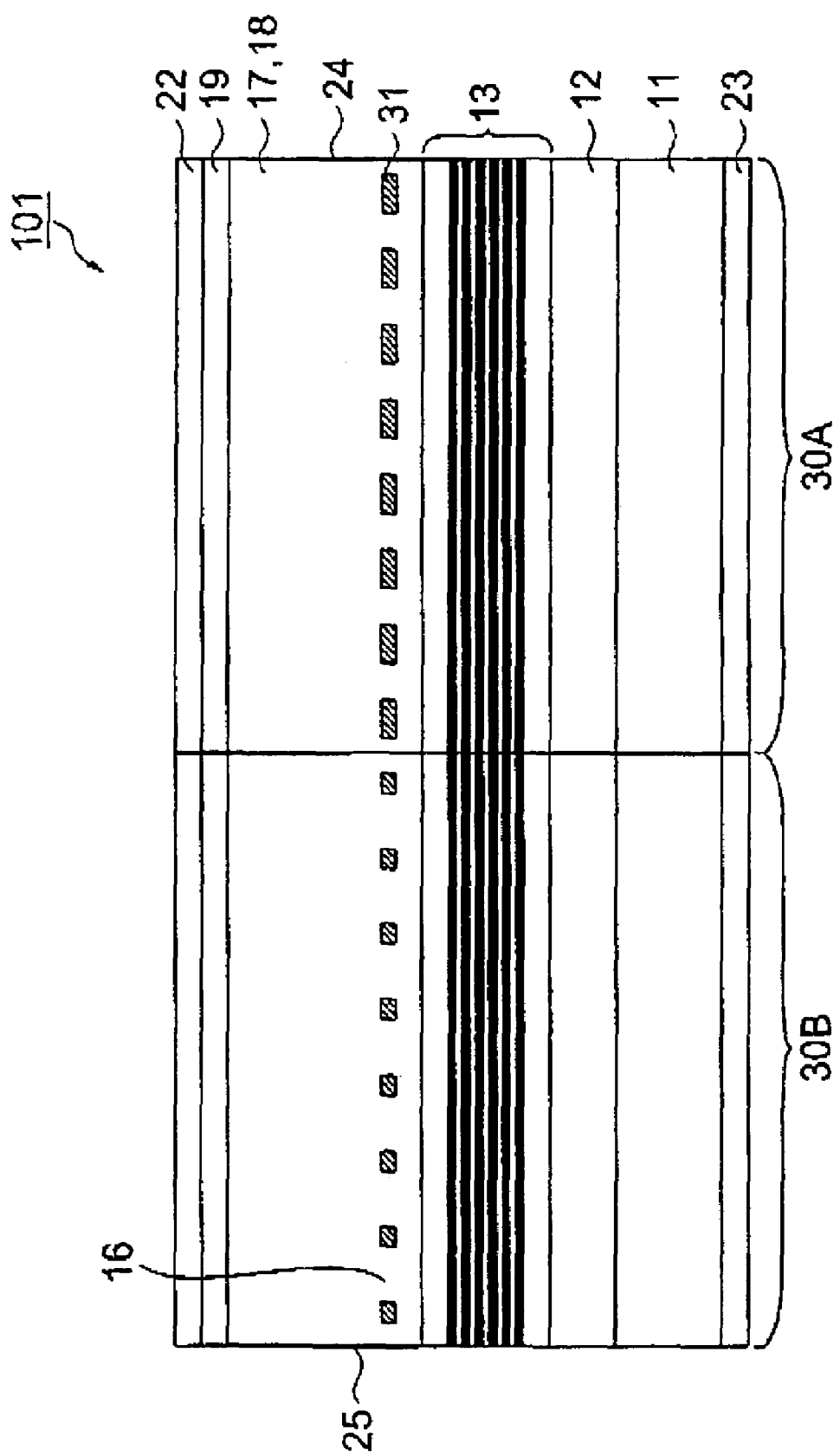
FIG. 9 is a sectional view taken along line IX—IX in FIG. 8.

Referring to FIG. 9, the InGaAsP diffraction grating 31 has a first half area i.e, large coupling factor area 30A wherein the coupling factor κ is 40 cm$^{-1}$ and a second half area, i.e., small coupling factor area 30B wherein the coupling factor κ is 20 cm$^{-1}$.

The resist pattern for the diffraction grating 31 is formed by a two-step EB irradiation process, wherein the large coupling factor area 30A is subjected to a first EB exposure step using an irradiation current of 0.2 nA and a dosage of 1.35 μs/dot (micro-second per dot), and the small coupling factor area 30B is subjected to a second EB exposure step using an irradiation current of 0.2 nA and a dosage of 1.15 μs/dot. It is to be noted that the order of these steps itself may be selected as desired. The spatial period Λ of the diffraction grating 31 is designed by using the relationship $\Lambda = \lambda_{DFB}/2n_{eff}$, wherein $\lambda_{DFB}$ is the design emission wavelength and $n_{eff}$ is the effective refractive index of the diffraction grating with respect to the lateral mode of the desired order of the optical emission.

Figure 10:
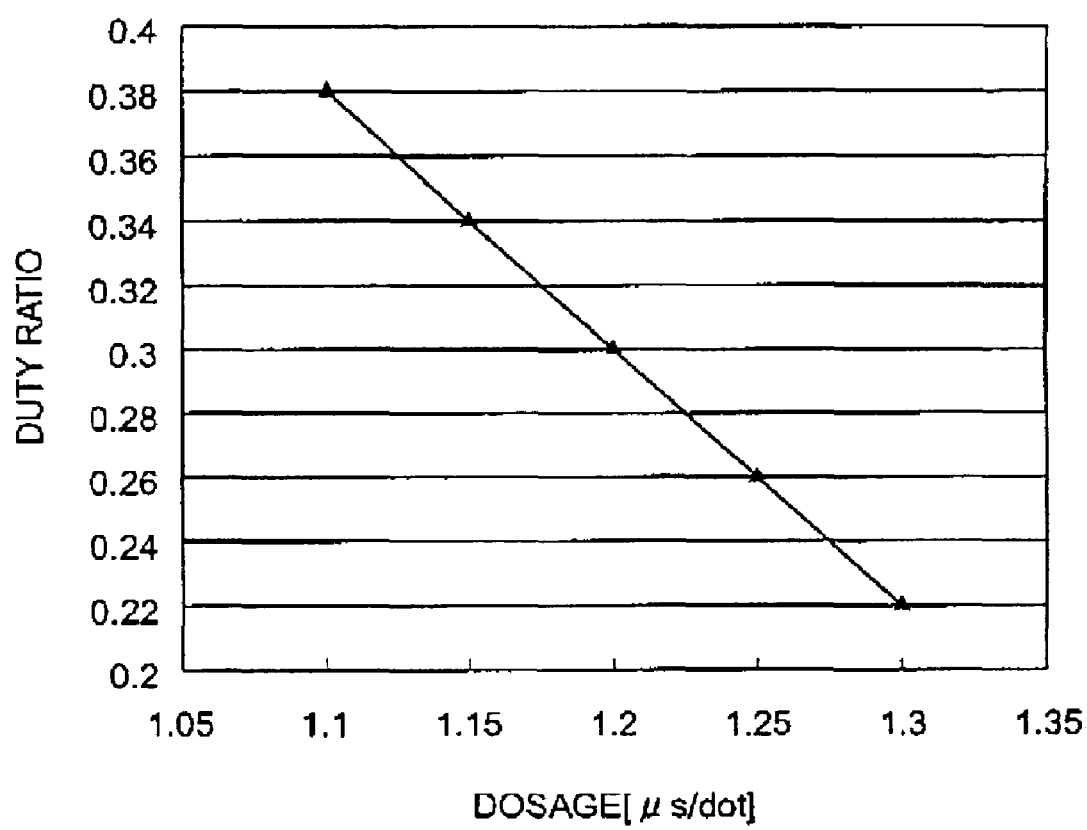
FIG. 10 is a graph showing the relationship between the duty ratio of the laser device and the dosage of the electron-beam (EB) irradiation in the fabrication process for the third embodiment.

Referring to FIG. 10, there is shown the relationship between the duty ratio of the InGaAsP diffraction grating 31 and the dosage in the EB irradiation step of the fabrication process for the present embodiment. As shown in this figure, the dosage of the EB irradiation step accurately controls the duty ratio of the diffraction grating, which is 0.18 at a dosage of 1.35 μs/dot and is about 0.34 at a dosage of 1.15 μs/dot.

Due to the configuration wherein the coupling factor κ is higher in the first area near the front facet (emission facet) 24 of the laser cavity than in the second area near the rear facet 25, the difference in the profile of the optical output power distribution is suppressed, whereby the optical output power in the central area of the laser cavity as viewed in the axial direction thereof is increased, thereby achieving a narrow spectral linewidth of the laser emission.

A variety of measurements were conducted to samples of the present embodiment in order to evaluate the performances of the present embodiment. The threshold currents of these samples were about 15 mA, and an excellent single mode characteristic could be obtained therein. Among these samples, some samples each having a ratio Pf/Pr of the optical output power Pf at the front facet 24 to the optical output power Pr at the rear facet 25 which is between 5 and 20 were subjected to the measurement of the minimum spectral linewidth while changing the optical output power. The minimum spectral linewidths thus measured were as small as around 0.8 MHz at an optical output power of 20 mW, which was satisfactory.

For confirming the results of the present embodiment, samples of a comparative example were fabricated according to the conventional technique. The comparative example was fabricated similarly to the present embodiment except that the dosage of the EB irradiation step was 1.25 μs/dot in the comparative example, which resulted in a duty ratio of 0.26 for the diffraction grating therein, as would be expected from FIG. 14. Each sample of the comparative example exhibited a minimum spectral linewidth of about 1 MHz at an optical output power of 20 mW. Thus, the advantage of the present embodiment could be confirmed.

Fourth Embodiment

Figure 11:
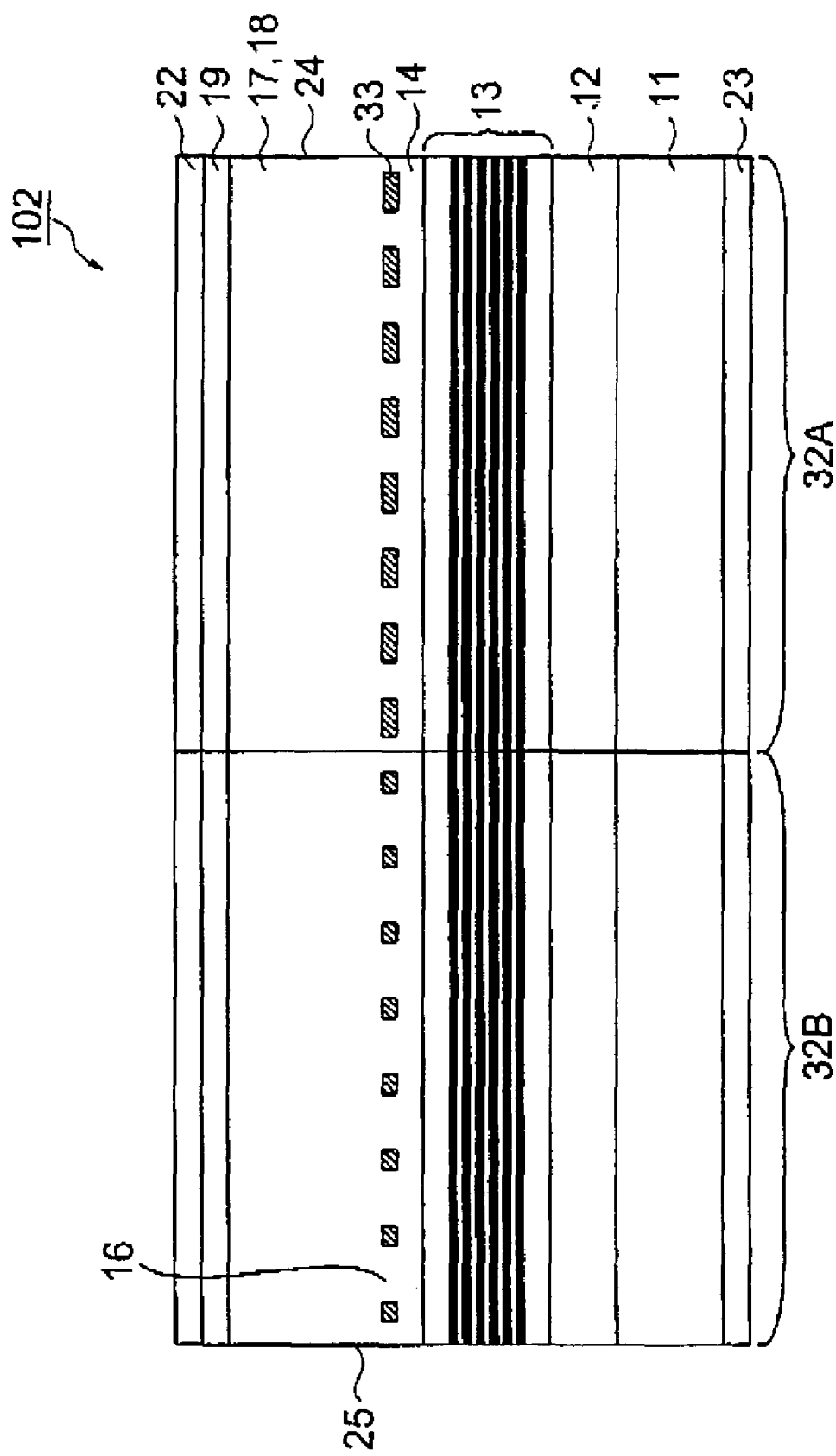
FIG. 11 is a sectional view of a DFB laser device according to a fourth embodiment of the present invention, taken along the axial direction of the laser cavity.

Referring to FIG. 11, a DFB laser device, generally designated by numeral 102, according to a fourth embodiment of the present invention is similar to the third embodiment except that the coupling factor κ of the InGaAs diffraction grating 33 is 20 cm$^{-1}$ in the first half area 32A near the front facet 24, and is 40 cm$^{-1}$ in the second half area 32B near the rear facet 25. The DFB laser device of the present embodiment has an emission wavelength of 1550 nm, and a cavity length of 500 μm.

The diffraction grating 33 in these half areas 32A and 32B are obtained by dosages of 1.15 μs/dot and 1.35 μ/dot, respectively, in the EB irradiation step.

Due to the configuration wherein the coupling factor κ of the InGaAsP diffraction grating 33 is smaller near the front facet 24 and is larger near the rear facet 25, the difference in the optical output power profile in the axial direction of the laser cavity is reduced, thereby suppressing generation of the hole burning at a high optical output power and increase of the spectral linewidth occurring due to a re-broadening phenomenon. The control of the dosage in the half areas 32A and 32B for controlling the duty ratio of the diffraction grating 33 achieves a more accurate control of the coupling factor κ.

Samples of the present embodiment were fabricated Among these samples, some samples each having a ratio Pf/Pr of the output power Pf at the front facet to the output power Pr at the rear facet which is between 5 and 20 were subjected to measurements of minimum spectral linewidth. The spectral linewidth thus measured exhibited about 1.8 MHz at an optical output power of about 80 mW.

For confirming the performances of the present embodiment, samples of a comparative example were manufactured. These samples exhibited a spectral linewidth of about 2.2 MHz at an optical output power of about 80 mW. Thus, the advantage of the present embodiment could be confirmed.

Fifth Embodiment

Figure 12:
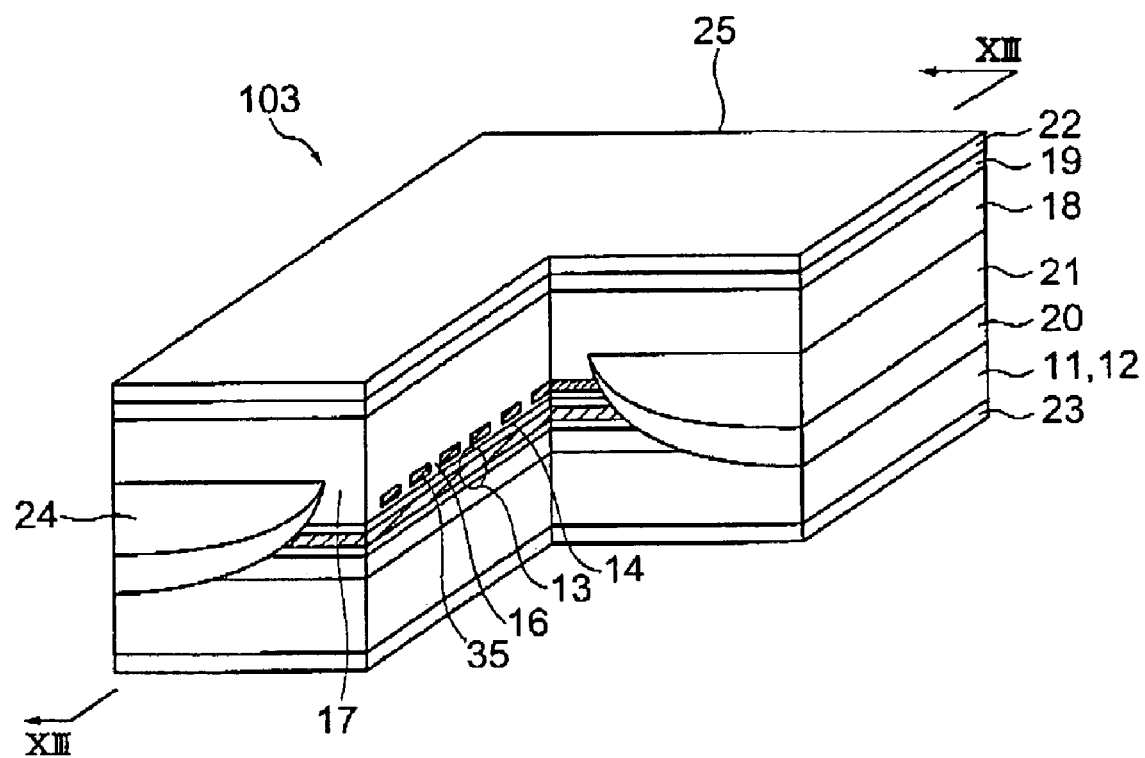
FIG. 12 is a partially cut-out perspective view of a DFB laser device according to a fifth embodiment of the present invention.

Referring to FIG. 12, a DFB laser device, generally designated by numeral 103, according to a fifth embodiment of the present invention has an emission wavelength of 1550 nm and a cavity length of 800 μm. The substrate 11, layer structure and mesa structure of the DFB laser device 103 of the present embodiment are similar to those in the first embodiment except that the detuning amount of the MQW-SCH active layer 13, which is generally defined by the peak gain wavelength minus the emission wavelength, is set at −10 nm in the present embodiment.

The detuning amount defined as above is an important parameter, which affects the laser characteristic of the DFB laser device. It is generally considered that a negative value for the detuning amount is effective for achieving a narrow spectral linewidth of the laser emission. In the present embodiment, the detuning amount is set at −10 nm as described above.

Figure 13:
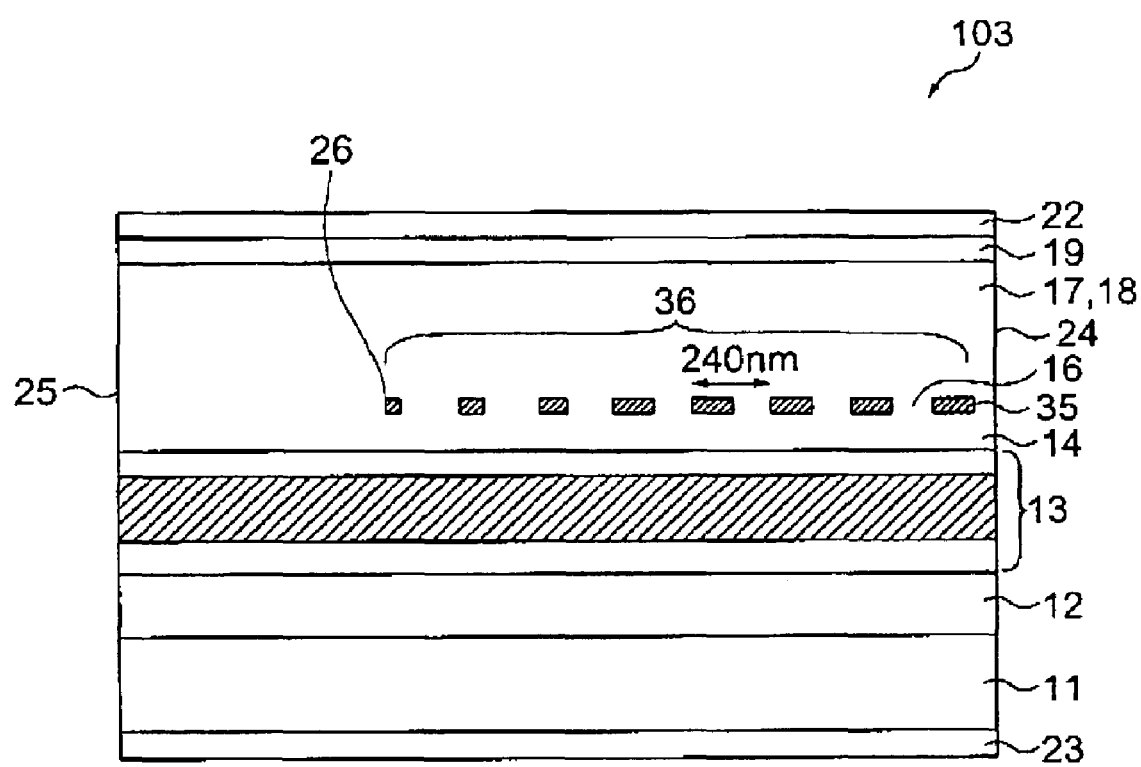
FIG. 13 is a sectional view taken along line XIII—XIII in FIG. 12.

Referring to FIG. 13, the InGaAsP diffraction grating 35 having a film thickness of 20 nm and a spatial duration of 240 nm is formed in a diffraction grating area 36 having a length of 550 μm in the axial direction of the laser cavity and disposed near the front facet 24 thereof. The length of the diffraction grating area 36 is about 69% of the total cavity length. The diffraction grating 35 has a duty ratio of about 25%, which reduces monotonically or continuously toward the rear end 26 of the diffraction grating 35 in the vicinity of the rear end 26. More concretely, the diffraction grating eventually fade away or disappears in a vicinity of the rear end of the diffraction grating as viewed toward the rear end of the diffraction grating.

The product κLg of the coupling factor κ by the length Lg of the diffraction grating 35, i.e., the diffraction grating area 36 is set at 1.0 in the present embodiment. It is to be noted that these configurations are exemplified herein and may be varied from the recited values. For example, the thickness of the diffraction grating may be 30 nm.

For patterning the diffraction grating 35, a resist film having a thickness of 100 nm is first formed on an InGaAsP diffraction grating layer by a coating technique, and subjected to an EB irradiation step to have a diffraction grating pattern thereon. The resultant diffraction grating pattern is disposed in the area of 550 μm, has a spatial duration of 240 nm and a duty ratio of about 25%, wherein the duty ratio reduces monotonically in the vicinity of the rear end 26 of the diffraction grating 35.

In the patterning for the diffraction grating mask, the dosage of the EB irradiation step is controlled in the vicinity of the rear end 26 of the diffraction grating 35 so that the duty ratio reduces monotonically.

The diffraction grating area having a length set at 69% of the cavity length achieves a higher single-mode product yield of the laser devices, which is defined by the number of products each having a satisfactory single mode characteristic to the number of the total DFB laser devices manufactured.

The structure of the monotonic reduction of the duty ratio in the InGaAsP diffraction grating 35 provides a uniform profile of the optical-electric field within the laser cavity in the vicinity of the rear end 26 of the diffraction grating 35, thereby suppressing the hole burning problem occurring at a high injected current and achieving a narrow spectral linewidth of the laser emission. The monotonic reduction of the duty ratio may be replaced by a stepwise reduction of the duty ratio.

A variety of measurements were conducted for evaluating the performances of the DFB laser device of the present embodiment. The samples used therein were selected from those disposed in the central area of the wafer for selecting the laser devices including the MQW-SCH active layers 13 having alike bandgap wavelengths.

The single-mode product yield was satisfactorily at about 87% in the present embodiment. In addition, the spectral linewidth of the samples at an optical output power of 60 mW and a spectral intensity of −3 dB exhibited 0.6 MHz with a standard deviation of 0.02 MHz, which was satisfactory as the spectral linewidth at a high optical output power.

Samples of a comparative example were manufactured according to the conventional technique for confirming the DFB laser device of the present embodiment. The comparative example is similar to the present embodiment except that the diffraction grating area has a length of 450 μm which is about 56% of the cavity length of 800 μm, and that the duty ratio of the diffraction grating is fixed at 25% in the diffraction grating area and abruptly assumes zero at the rear end 26 of the diffraction grating.

The samples were selected from the DFB laser devices manufactured in the central area of the wafer and subjected to measurements similarly to the embodiment. The comparative example exhibited a single-mode product yield of 62%, a spectral linewidth of 1.0 MHz at an optical output power of 60 mW and a spectral intensity of −3 dB with the standard deviation thereof being 0.023 MHz.

From the results of the measurements for the present embodiment and the comparative example, it was concluded that the DFB laser device of the present embodiment achieved a higher single-mode product yield, and a narrow spectral linewidth at a higher optical output power.

Sixth Embodiment

Figure 14A:
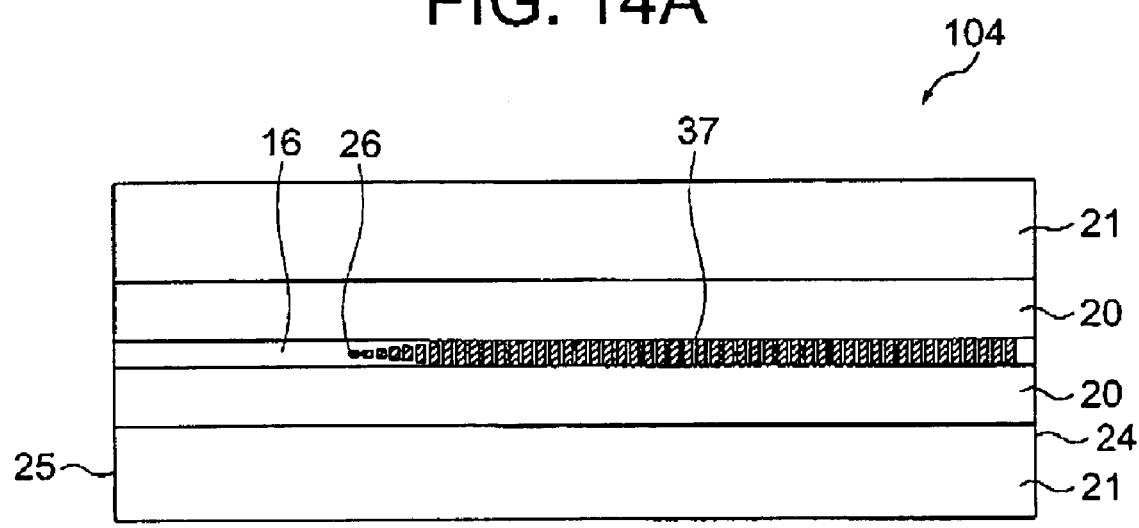
FIG. 14A is a top plan view of an InGaAsP diffraction grating in a DFB laser device according to a sixth embodiment of the present invention.
Figure 14B:
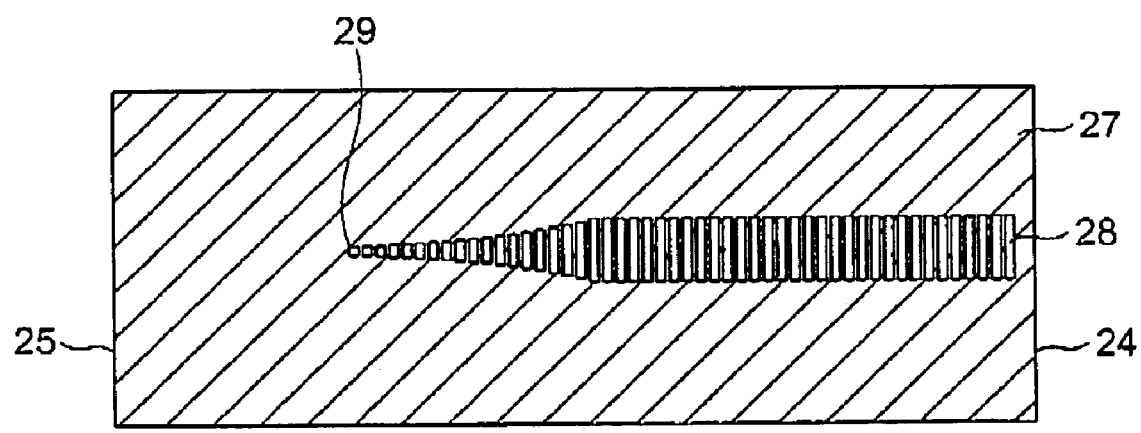
FIG. 14B is a detailed top plan view of a mask for the InGaAsP diffraction grating of FIG. 14A in a fabrication step thereof.

Referring to FIG. 14A, there is shown a top plan view of the InGaAsP diffraction grating in a DFB laser device 104 according to a sixth embodiment of the present invention. The DFB laser device 104 of the present embodiment is similar to the fifth embodiment except that the width of the diffraction grating 37 reduces toward the rear end 26 of the diffraction grating 37 in the vicinity of the rear end 26 of the diffraction grating 37. In other words, the lengths of the corrugation patterns of the diffraction grating 37 monotonically reduce toward the rear end 26 of the diffraction grating 37 in the vicinity of the rear end 26 in the present embodiment.

The monotonic reduction of the lengths of the corrugation patterns in the present embodiment may be replaced by a stepwise reduction of the lengths of the corrugation patterns.

Figure 15A:
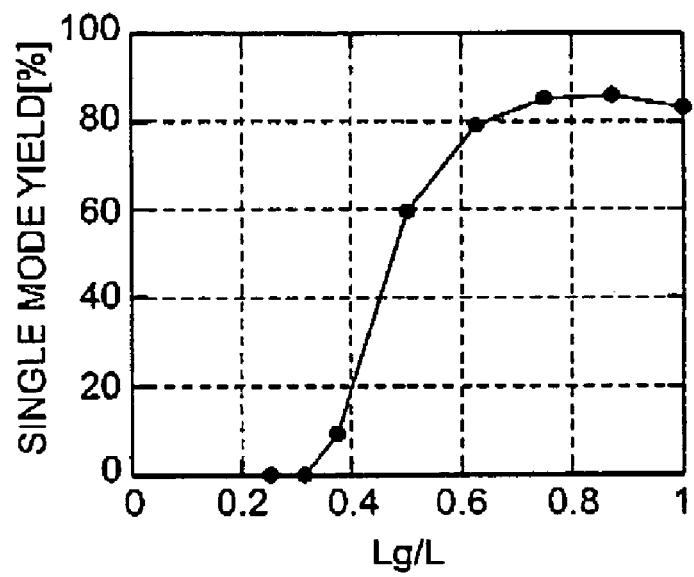
FIG. 15A is a graph showing the relationship obtained by simulation between the single-mode yield and the ratio Lg/L of the length Lg of the diffraction grating to the cavity length L.

The fifth and sixth embodiments are fabricated according to the third aspect of the present invention, which is devised based on the findings as described below. FIG. 15A shows the general relationship between the single-mode product yield and the ratio Lg/L of the length Lg of the diffraction grating to the cavity length L. The simulation is performed by changing the length Lg of the diffraction grating in a conventional DFB laser device having a cavity length of 800 μm and a product κLg of 1. The target of the single mode characteristic to be achieved by the products is that the difference (ΔαL) in the reflector loss between the main mode and the subordinate mode equals or exceeds 0.1. Thus, the single-mode product yield is calculated by the ratio of the number of the products that achieved this single mode characteristic to the number of the total products.

As understood from FIG. 15A, the length Lg of the diffraction grating should be 50% of the cavity length L or above for achieving a single-mode product yield of 60% or above, and should be 65% of the cavity length L or above for achieving a single-mode product yield.

Figure 15B:
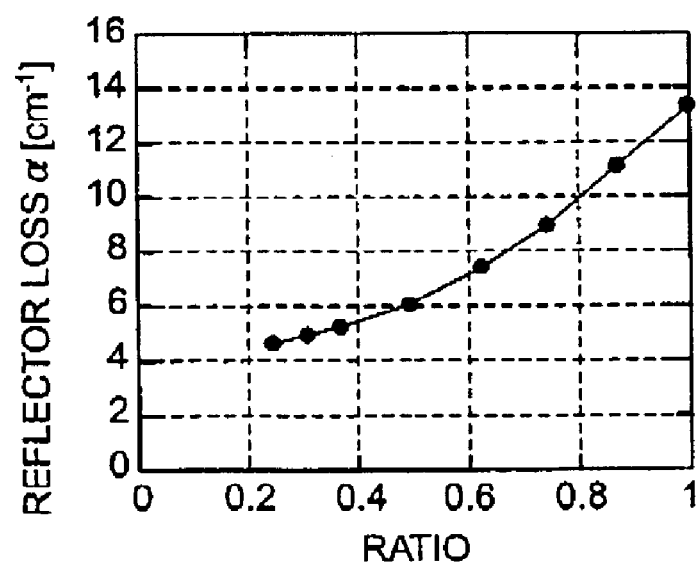
FIG. 15B is a graph showing the relationship obtained by simulation between the reflector loss $\alpha$ and the ratio Lg/L of the length Lg of the diffraction grating to the cavity length L.
Figure 16A:
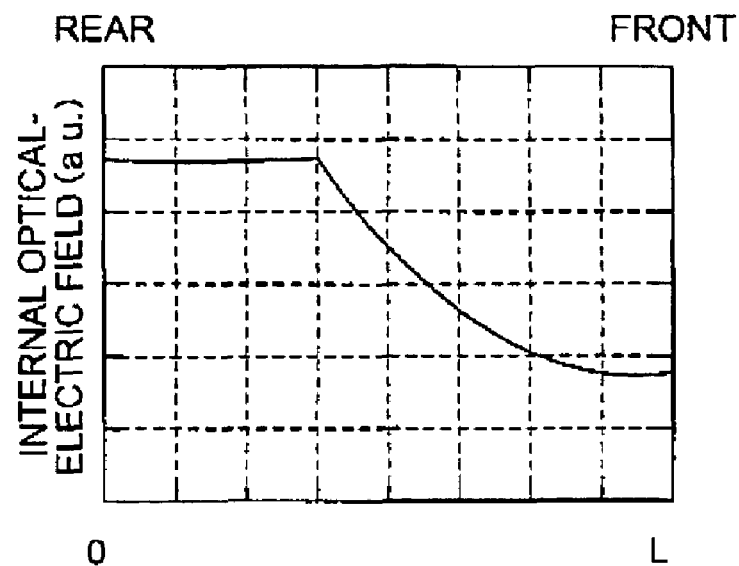
FIGS. 16A and 16B are graphs showing the optical-electric-field distribution profiles in the lasing direction within the laser cavity of a conventional laser device, and a DFB laser device of an embodiment.
Figure 16B:
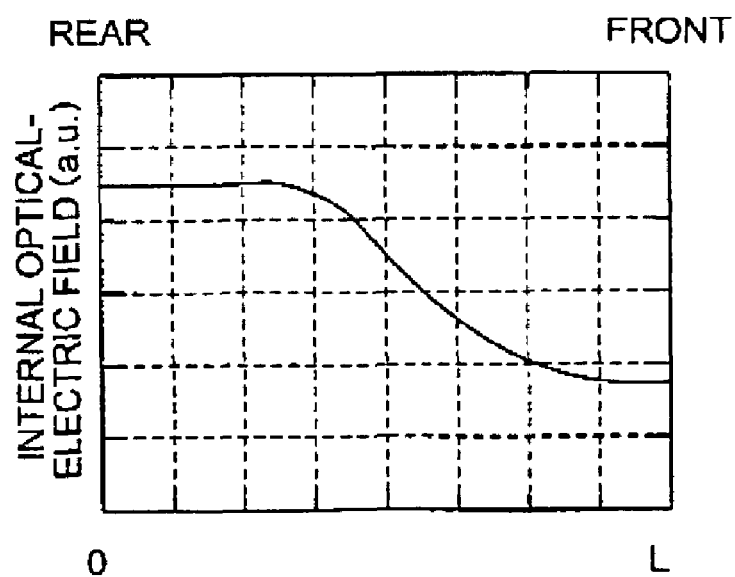

FIG. 15B shows the relationship between the reflector loss α(cm$^{-1}$) and the ratio of the length Lg of the diffraction grating to the cavity length L, obtained by simulation in the conditions similar to those recited in connection with FIG. 15A. The reflector loss α is the index of the spectral linewidth of the laser emission, wherein a smaller reflector loss α theoretically affords a narrower spectral linewidth. As shown in FIG. 15B, a ratio 95% or above for the length Lg of the diffraction grating is not preferable due to a larger reflector loss. It is to be noted that a smaller reflector loss affords a smaller threshold current and yet a lower optical efficiency.

In view of the above, the length Lg of the diffraction grating in a DFB laser device having a cavity length L of 500 µm or above should be preferably 50% of the cavity length L or above, and more preferably 65% or above, and should be 95% or below. The area for the diffraction grating is not limited to the area near the front end of the laser cavity, and may be disposed at any position with respect to the laser cavity.

Since the above embodiments are described only for examples, the present invention is not limited to the above embodiments and various modifications or alterations can be easily made therefrom by those skilled in the art without departing from the scope of the present invention.

What is claimed is:

1. A distributed feedback (DFB) semiconductor laser device comprising:
    a laser cavity disposed between a first facet and a second facet of said laser device for emitting laser therefrom in an axial direction of said laser cavity; and
    a diffraction grating extending parallel to said axial direction for feedback of the laser to said laser cavity, said diffraction grating including a number (t) of corrugation patterns, which are arranged in said axial direction at a specified pitch except for some of said corrugation patterns, wherein:
    the number (t) of said corrugation patterns satisfies the following relationship:

$t < Lg \times 2n_{eff}/\lambda_{DFB}$, wherein Lg, $\lambda_{DFB}$, and $n_{eff}$ are a length of said diffraction grating, a desired emission wavelength, and an effective refractive index; respectively, and wherein:
    the order of said corrugation patterns in said diffraction grating is not an integer;
    some of corrugation patterns are omitted at a constant pitch in the axial direction of the laser cavity; and
    the laser cavity has a cavity length of 500 micrometers or above.

2. The DFB semiconductor laser device according to claim 1, wherein the number (t) further satisfies the following relationship:

$Lg \times n_{eff}/\lambda_{DFB} < t$.

3. The DFB semiconductor laser device according to claim 1, wherein said corrugation patterns form a plurality of pattern groups each including a fixed number of said corrugation patterns arranged at said specified pitch except for a specified number of corrugation patterns being omitted out of said fixed number of said corrugation patterns.

4. The DFB semiconductor laser device according to claim 3, wherein relative locations of omission of said corrugation patterns are common to said pattern groups.

5. The DFB semiconductor laser device according to claim 3, wherein each of said pattern groups has a length of 30 µm or smaller in said axial direction.

6. The DFB semiconductor laser device according to claim 3, wherein each of said pattern groups has a length of 3 µm or smaller in said axial direction.

7. The DFB semiconductor laser device according to claim 3, wherein said fixed number is 100 or less.

8. The DFB semiconductor laser device according to claim 3, wherein said fixed number is 10 or less.

9. The DFB semiconductor laser device according to claim 3, wherein a ratio of said specified number to said fixed number is between ⅕ and ½.

10. The DFB semiconductor laser device according to claim 1, wherein said laser cavity has a cavity length of 500 µm or above.

11. The DFB semiconductor laser device according to claim 1, wherein said first facet has a first reflection coating film and said second facet has a second reflection coating film having a higher reflectivity than a reflectivity of said first reflection coating film.

12. A method for designing a distributed feedback (DFB) semiconductor laser device having: a laser cavity disposed between a first facet and a second facet of said laser device for emitting laser therefrom in an axial direction of said laser cavity; and a diffraction grating extending parallel to said axial direction for feedback of the laser to said laser cavity, said diffraction grating including a plurality of corrugation patterns, which are arranged in said axial direction at a specified pitch except for a number of said corrugation patterns being omitted, the laser cavity having a cavity length of 500 microns or above, said method comprising the step of:
    selecting a number of said corrugation patterns being omitted to control a coupling factor of said diffraction grating, wherein some of corrugation patterns are omitted at a constant pitch in the axial direction of the laser cavity.

13. A distributed feedback (DFB) semiconductor laser device comprising:
    a laser cavity disposed between a first facet and a second facet of said laser device for emitting laser therefrom in an axial direction of said laser cavity;
    a diffraction grating having a grating length extending parallel to said axial direction of the laser cavity for feedback of the laser to said laser cavity;
    the diffraction grating included within the grating length,
    a plurality of periodic structures, each of the structures having an axial dimension, and
    a separation distance separating adjacent ones of the periodic structures to form a duty ratio of said axial dimension to said separation distance,
    wherein the duty ratio changes along the grating length such that a region of the diffraction grating toward the first facet has a higher duty ratio than a region of the diffraction grating toward the second facet,
    wherein said diffraction grating includes a plurality of periodic structures arranged in said axial direction, a distance between said first facet of said laser cavity and a corresponding first end of said diffraction grating is larger than a distance between said second facet of said laser cavity and a corresponding second end of said diffraction grating, and said diffraction grating eventually disappears in a vicinity of said first end of said diffraction grating as viewed toward said first end of said diffraction grating.

14. A distributed feedback (DFB) semiconductor laser device comprising:
    a laser cavity disposed between a first facet and a second facet of said laser device for emitting laser therefrom in an axial direction of said laser cavity;

a diffraction grating having a grating length extending parallel to said axial direction of the laser cavity for feedback of the laser to said laser cavity;

the diffraction grating included within the grating length, a plurality of periodic structures, each of the structures having an axial dimension, and a separation distance separating adjacent ones of the periodic structures to form a duty ratio of said axial dimension to said separation distance, wherein the duty ratio changes along the grating length such that a region of the diffraction grating toward the first facet has a higher duty ratio than a region of the diffraction grating toward the second facet, wherein said diffraction grating includes a plurality of periodic structures arranged in said axial direction, a distance between said first facet of said laser cavity and a corresponding first end of said diffraction grating is larger than a distance between said second facet of said laser cavity and a corresponding second end of said diffraction grating, and a number of said periodic structures per unit axial length of said laser cavity reduces in a vicinity of said first end of said diffraction grating as viewed toward said first end of said diffraction grating.

15. A distributed feedback (DFB) semiconductor laser device comprising:

a laser cavity disposed between a first facet and a second facet of said laser device for emitting laser therefrom in an axial direction of said laser cavity;

a diffraction grating having a grating length extending parallel to said axial direction of the laser cavity for feedback of the laser to said laser cavity;

the diffraction grating included within the grating length, a plurality of periodic structures, each of the structures having an axial dimension, and a separation distance separating adjacent ones of the periodic structures to form a duty ratio of said axial dimension to said separation distance, wherein the duty ratio changes along the grating length such that a region of the diffraction grating toward the first facet has a higher duty ratio than a region of the diffraction grating toward the second facet, wherein said diffraction grating includes a plurality of periodic structures arranged in said axial direction, a distance between said first facet of said laser cavity and a corresponding first end of said diffraction grating is larger than a distance between said second facet of said laser cavity and a corresponding second end of said diffraction grating, and the duty ratio of said diffraction grating reduces in a vicinity of said first end of said diffraction grating as viewed toward said first end of said diffraction grating.

16. A distributed feedback (DFB) semiconductor laser device comprising:

a laser cavity disposed between a first facet and a second facet of said laser device for emitting laser therefrom in an axial direction of said laser cavity;

a diffraction grating having a grating length extending parallel to said axial direction of the laser cavity for feedback of the laser to said laser cavity;

the diffraction grating included within the grating length, a plurality of periodic structures, each of the structures having an axial dimension, and a separation distance separating adjacent ones of the periodic structures to form a duty ratio of said axial dimension to said separation distance.

wherein the duty ratio changes along the grating length such that a region of the diffraction grating toward the first facet has a higher duty ratio than a region of the diffraction grating toward the second facet, wherein said diffraction grating includes a plurality of periodic structures arranged in said axial direction, a distance between said first facet of said laser cavity and a corresponding first end of said diffraction grating is larger than a distance between said second facet of said laser cavity and a corresponding second end of said diffraction grating, and the width of said diffraction grating reduces in a vicinity of said first end of said diffraction grating as viewed toward said first end of said diffraction grating.

* * * * *